(12) United States Patent
Ko

(10) Patent No.: US 8,053,304 B2
(45) Date of Patent: Nov. 8, 2011

(54) METHOD OF FORMING HIGH-MOBILITY DEVICES INCLUDING EPITAXIALLY GROWING A SEMICONDUCTOR LAYER ON A DISLOCATION-BLOCKING LAYER IN A RECESS FORMED IN A SEMICONDUCTOR SUBSTRATE

(75) Inventor: Chih-Hsin Ko, Fongshan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 76 days.

(21) Appl. No.: 12/618,004

(22) Filed: Nov. 13, 2009

(65) Prior Publication Data

US 2010/0213512 A1 Aug. 26, 2010

Related U.S. Application Data

(60) Provisional application No. 61/155,083, filed on Feb. 24, 2009.

(51) Int. Cl.
*H01L 21/335* (2006.01)

(52) U.S. Cl. .. 438/222; 438/221; 438/275; 257/E21.461

(58) Field of Classification Search .................. 438/199, 438/218, 221–223, 275; 257/21.461
See application file for complete search history.

(56) References Cited

U.S. PATENT DOCUMENTS

| | | | |
|---|---|---|---|
| 4,963,949 A | 10/1990 | Wanlass et al. | |
| 5,479,033 A * | 12/1995 | Baca et al. | |
| 5,728,623 A | 3/1998 | Mori | |
| 6,107,653 A | 8/2000 | Fitzgerald | |
| 6,815,278 B1 * | 11/2004 | Ieong et al. | |
| 7,199,017 B2 * | 4/2007 | Gonzalez et al. | |
| 7,226,833 B2 * | 6/2007 | White et al. | |
| 7,268,377 B2 * | 9/2007 | Ieong et al. | |
| 7,378,306 B2 * | 5/2008 | Spencer et al. | |
| 7,432,149 B2 * | 10/2008 | Wu et al. | |
| 7,524,707 B2 * | 4/2009 | Adetutu et al. | |
| 7,626,246 B2 * | 12/2009 | Lochtefeld et al. | |
| 7,700,420 B2 * | 4/2010 | Thean et al. | |
| 2001/0003364 A1 * | 6/2001 | Sugawara et al. | |
| 2001/0045604 A1 * | 11/2001 | Oda et al. | |
| 2004/0256700 A1 * | 12/2004 | Doris et al. | |
| 2005/0093104 A1 * | 5/2005 | Ieong et al. | .................... 257/627 |

(Continued)

OTHER PUBLICATIONS

Hudait, M.K., et al., "Heterogeneous Integration of Enhancement Mode $In_{0.7}Ga_{0.3}As$ Quantum Well Transistor on Silicon Substrate using Thin ($\leqq 2$ µm) Composite Buffer Architecture for High-Speed and Low-voltage (0.5V) Logic Applications," IEEE, 2007, pp. 625-628.

*Primary Examiner* — Anh Mai
(74) *Attorney, Agent, or Firm* — Slater & Matsil, L.L.P.

(57) ABSTRACT

A method of forming an integrated circuit structure includes forming a first recess in the semiconductor substrate; and forming a dislocation-blocking layer in the first recess. The dislocation-blocking layer includes a semiconductor material. Shallow trench isolation (STI) regions are formed, wherein inner portions of the STI regions are directly over portions of the dislocation-blocking layer, and wherein inner sidewalls of the STI regions contact the dislocation-blocking layer. A second recess is formed by removing a portion of the dislocation-blocking layer between two of the inner sidewalls of the STI regions, with the two inner sidewalls facing each other. A semiconductor region is epitaxially grown in the second recess.

20 Claims, 4 Drawing Sheets

U.S. PATENT DOCUMENTS

| | | |
|---|---|---|
| 2006/0049460 A1* | 3/2006 | Chen et al. .................... 257/347 |
| 2007/0218659 A1* | 9/2007 | Spencer et al. ............... 438/497 |
| 2007/0252215 A1* | 11/2007 | Ieong et al. ................... 257/369 |
| 2008/0036028 A1* | 2/2008 | Chan et al. .................... 257/506 |
| 2008/0203442 A1* | 8/2008 | Ieong et al. ................... 257/255 |
| 2008/0217690 A1* | 9/2008 | Mandelman et al. ......... 257/351 |
| 2008/0268587 A1* | 10/2008 | Sadaka et al. ................. 438/199 |
| 2008/0274594 A1* | 11/2008 | Karve et al. ................... 438/153 |
| 2008/0274595 A1* | 11/2008 | Spencer et al. ............... 438/154 |

* cited by examiner

METHOD OF FORMING HIGH-MOBILITY DEVICES INCLUDING EPITAXIALLY GROWING A SEMICONDUCTOR LAYER ON A DISLOCATION-BLOCKING LAYER IN A RECESS FORMED IN A SEMICONDUCTOR SUBSTRATE

This application claims the benefit of U.S. Provisional Application No. 61/155,083 filed on Feb. 24, 2009, entitled "High-Mobility Channel Devices on Dislocation-Blocking Layers," which application is hereby incorporated herein by reference.

TECHNICAL FIELD

This invention relates generally to semiconductor devices, and particularly to methods for integrating PMOS devices having high hole-mobility channels and NMOS devices having high electron-mobility channels on a same chip and the respective integrated circuit structures.

BACKGROUND

The scaling of integrated circuits is a constant effort. With circuits becoming smaller and faster, improvement in the device drive current of metal-oxide-semiconductor (MOS) devices becomes more important. The device drive current is closely related to the ratio of gate width to gate length and to carrier mobility. Shortening poly-gate length and increasing carrier mobility can improve the device drive current. Gate length reduction is an on-going effort in order to shrink circuit size. However, due to the short channel effect, the gate-width to gate-length ratio, which directly affects the device drive current, is hard to increase. In order to further improve device drive current, enhancing carrier mobility has also been explored.

Germanium and the compound materials of group III and group V elements (such as GaAs, InP, GaN, also known as III-V compound materials) are among the materials that can provide improved carrier mobility. Germanium is a commonly known semiconductor material. The electron mobility and hole mobility of germanium are greater than that of silicon, hence making germanium an excellent material in the formation of integrated circuits, particularly for forming PMOS devices. However, in the past, silicon gained more popularity since its oxide (silicon oxide) is readily usable in the gate dielectric of MOS devices. The gate dielectrics of the MOS devices can be conveniently formed by thermal oxidation of silicon substrates. The oxide of germanium, on the other hand, is soluble in water, and hence is not suitable for the formation of gate dielectrics. With the use of high-k dielectric materials in the gate dielectrics of MOS transistors, the convenience provided by the silicon oxide is no longer a big advantage, and hence germanium is re-examined for use in integrated circuits. On the other hand, III-V compound materials have high electron mobility, and hence are suitable for forming NMOS devices.

The integration of III-V compound materials and/or germanium with silicon substrates, however, has resulted in difficulties. These materials have significant lattice mismatch with silicon substrates, and hence when formed on the silicon substrates, will have a high amount of crystal defects such as dislocations. Conventionally, buffer layers are used to reduce the dislocations. For example, in order to provide an InGaAs quantum well channel for NMOS devices, a GaAs buffer layer having a thickness of 2 μm is grown on a silicon substrate. An InAlAs buffer layer having a thickness of 1.2 μm is further grown on the GaAs buffer layer, followed by the growth of the InGaAs layer. However, this scheme suffers from drawbacks. First, the buffer layers that have a combined thickness of 3.2 μm are too thick for the integration of NMOS and PMOS devices. The PMOS devices may be lower than the NMOS devices by 3.2 μm, resulting in process difficulties. Second, the InGaAs layer is not suitable for forming PMOS devices, and hence an additional layer may need to be formed on the InGaAs layer for forming the PMOS devices. This results in further increases in the manufacturing cost. New methods are thus needed to solve the above-discussed problems.

SUMMARY OF THE INVENTION

In accordance with an embodiment of the present invention, a method of forming an integrated circuit structure includes forming a first recess in the semiconductor substrate; and forming a dislocation-blocking layer in the first recess. The dislocation-blocking layer includes a semiconductor material. Shallow trench isolation (STI) regions are formed, wherein inner portions of the STI regions are directly over portions of the dislocation-blocking layer, and wherein inner sidewalls of the STI regions contact the dislocation-blocking layer. A second recess is formed by removing a portion of the dislocation-blocking layer between two of the inner sidewalls of the STI regions, with the two of the inner sidewalls facing each other. A semiconductor region is epitaxially grown in the second recess. Other embodiments are also disclosed.

The advantageous features of the embodiments include reduced dislocation density, improved performance for both PMOS and NMOS devices, and reduced process difficulty due to the leveling of the PMOS and NMOS devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

The intermediate stages of manufacturing an embodiment, which includes a high-hole-mobility PMOS device and a high-electron-mobility NMOS device, are illustrated. The variations of the embodiment are discussed. Throughout the various views and illustrative embodiments of the present invention, like reference numbers are used to designate like elements.

Figure 1:
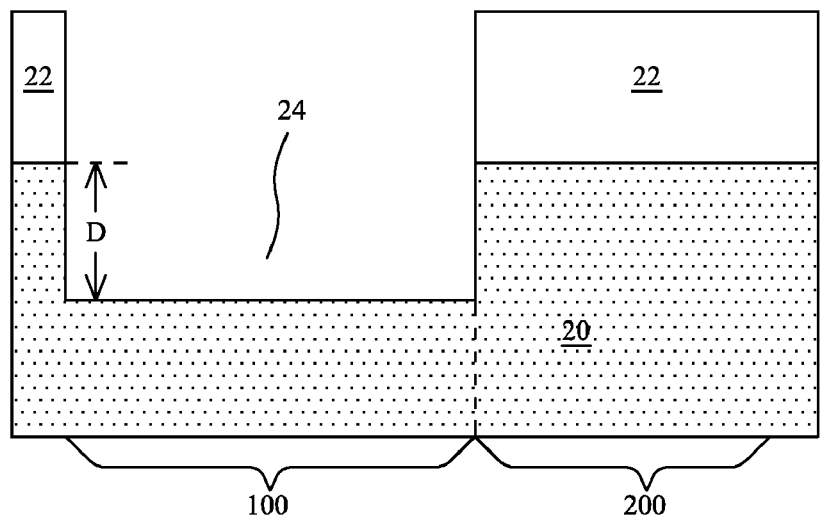
FIGS. 1 through 6 illustrate cross-sectional views and a top view of intermediate stages in the formation of an embodiment, wherein an epitaxial semiconductor region having a high hole mobility or a high electron mobility is grown in a semiconductor substrate.

Referring to FIG. 1, semiconductor substrate 20 is provided. In an embodiment, semiconductor substrate 20 is a bulk silicon substrate (and hence is referred to as silicon substrate 20 hereinafter) comprising substantially pure silicon. In alternative embodiments, semiconductor substrate 20 may be formed of other commonly used semiconductor materials such as silicon germanium (SiGe), silicon carbon (SiC), GaAs, or the like. Semiconductor substrate 20 includes region 100 and region 200, which will have MOS devices formed therein, as will be discussed in detail in subsequent paragraphs.

As is shown in FIG. 1, region 100 of semiconductor substrate 20 is recessed to form recess 24, while region 200 is protected from the recessing, for example, by mask 22 when the etching is performed. Recess 24 has depth D, which can be greater than the thickness of shallow trench isolation (STI) regions (not shown in FIG. 1, refer to FIG. 3A) that will be formed in subsequent steps. In alternative embodiments, depth D is smaller than the thickness of the STI regions. In an exemplary embodiment, depth D is several thousand angstroms. It is realized, however, that the dimensions recited throughout the description are merely examples, and may be changed if different formation technologies are used.

Figure 2:
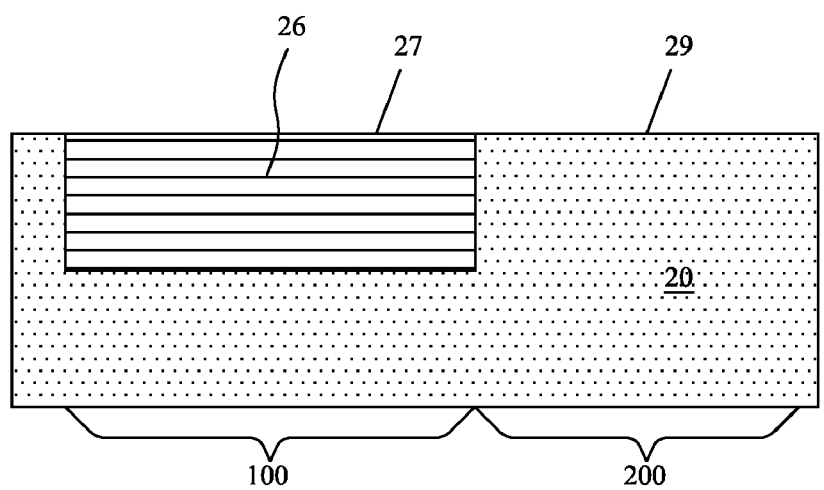

Next, as shown in FIG. 2, dislocation-blocking layer 26 is epitaxially grown in recess 24. In an embodiment, top surface 27 of dislocation-blocking layer 26 is substantially level with, although it may also be higher than or lower than, top surface 29 of semiconductor substrate 20 (in region 200). Accordingly, the thickness of dislocation-blocking layer 26 may be close to depth D of recess 24 (Please refer to FIG. 1). Dislocation-blocking layer 26 is used to trap dislocations therein, so that any semiconductor region formed on dislocation-blocking layer 26 may have a reduced dislocation density. Dislocation-blocking layer 26 includes a portion having a different lattice constant than semiconductor substrate 20. In an embodiment, dislocation-blocking layer 26 comprises a group III and group V compound semiconductor material (referred to as a III-V compound material hereinafter) including, but not limited to, GaAs, InP, GaN, InGaAs, InAlAs, GaAs, GaSb, AlSb, AlAs, AlP, GaP, combinations thereof, and multi-layers thereof. After the growth of dislocation-blocking layer 26, an annealing may be performed.

Alternatively, depending on the desired material of the channel region of the subsequently formed MOS device, dislocation-blocking layer 26 may include silicon germanium, which may be expressed as $Si_{1-x}Ge_x$, wherein x is the atomic percentage of germanium, and may be in the range of greater than 0 and equal to or less than 1. In an embodiment, dislocation-blocking layer 26 comprises substantially pure germanium (with x equal to 1). The germanium-containing dislocation-blocking layer 26 may be a layer having a substantially uniform germanium concentration from the bottom to the top, or a gradient layer having a gradient germanium concentration, which increases substantially continuously, or by stages, from the bottom to the top. In an exemplary embodiment, the bottom portion of germanium-containing dislocation-blocking layer 26 has a germanium concentration substantially close to zero percent, while upper portions of the germanium-containing dislocation-blocking layer 26 have higher germanium concentrations.

Figure 3A:
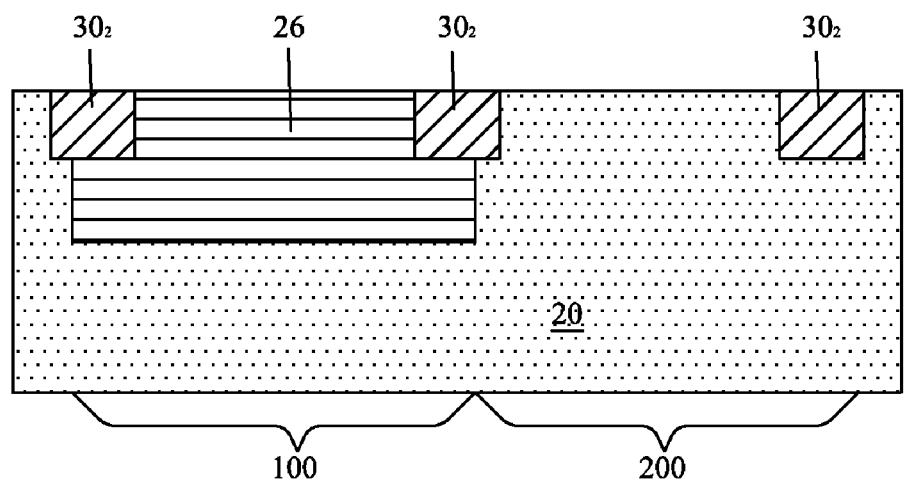
Figure 3B:
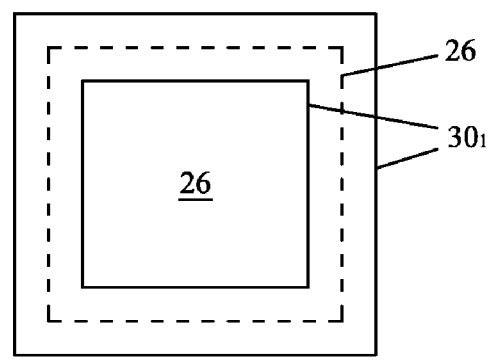

Referring to FIG. 3A, STI regions 30 (denoted as STI regions $30_1$ and $30_2$) are formed. STI regions $30_1$ may be formed solely in dislocation-blocking layer 26, or at the boundary regions of regions 100 and 200, with the inner portions of STI regions $30_1$ in dislocation-blocking layer 26, and a outer portion of STI regions $30_1$ in region 200. In an embodiment, the inner portions of STI regions $30_1$ overlap outer portions of dislocation-blocking layer 26. Alternatively, dislocation-blocking layer 26 is large enough to overlap substantially all of STI regions $30_1$. The overlapping of dislocation-blocking layer 26 and STI regions $30_1$ is illustrated in FIG. 3B, which is a top view of dislocation-blocking layer 26 and STI regions $30_1$. In an embodiment, as can be found in the top view, dislocation-blocking layer 26 and STI regions $30_1$ form a closed loop encircling a center region of dislocation-blocking layer 26. In other embodiments, STI regions $30_1$ do not form a closed loop, but include two portions facing each other, with a portion of dislocation-blocking layer 26 therebetween.

Referring again to FIG. 3A, the thickness of STI region 30 may be smaller than the thickness of dislocation-blocking layer 26, and hence there are remaining portions of dislocation-blocking layer 26 directly underlying the inner portions of STI regions $30_1$. In alternative embodiments, the thickness of STI regions $30_1$ is greater than the thickness of dislocation-blocking layer 26.

Figure 4A:
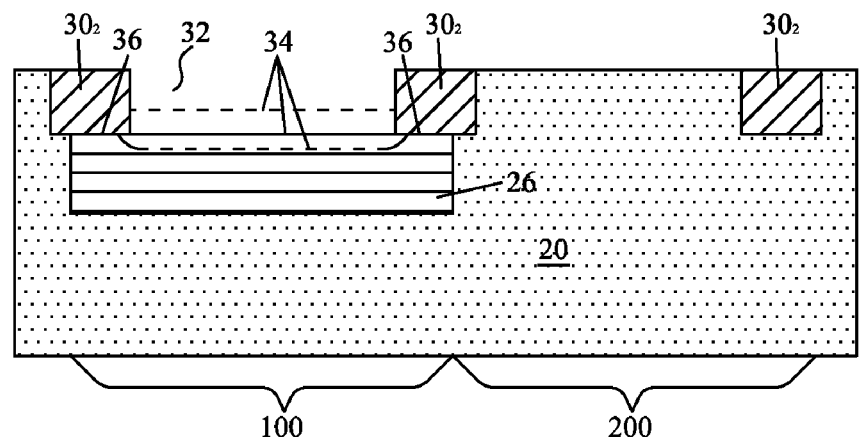
Figure 4B:
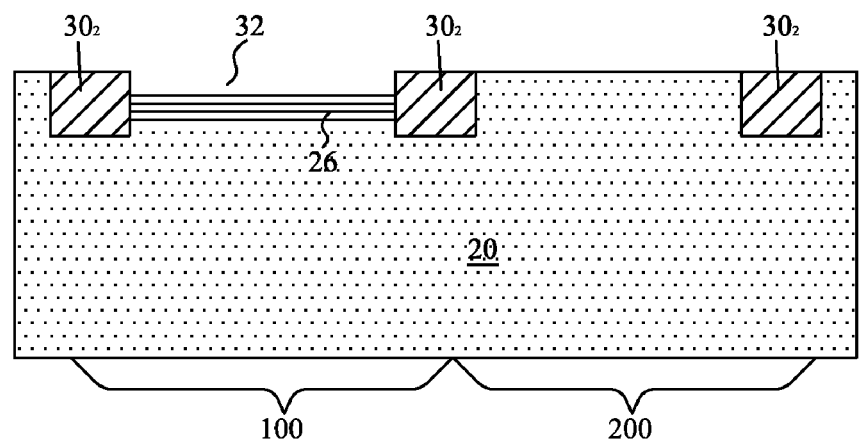

FIG. 4A illustrates the recessing of the center portion of dislocation-blocking layer 26 encircled by STI regions $30_1$ to form recess 32. The sidewalls of STI regions $30_1$ facing the center portion are exposed by the recessing step. In an embodiment, bottom 34 of recess 32 is substantially level with bottoms 36 of STI regions $30_1$. In other embodiments, bottom 34 of recess 32 may be higher or lower than bottoms 36, as shown by the dotted lines. When the thickness of dislocation-blocking layer 26 is less than the thickness of STI regions $30_1$, the depth of recess 32 should be less than the thickness of dislocation-blocking layer 26, as shown in FIG. 4B, so that a portion of dislocation layer 26 remains and is exposed through recess 32.

Figure 5:
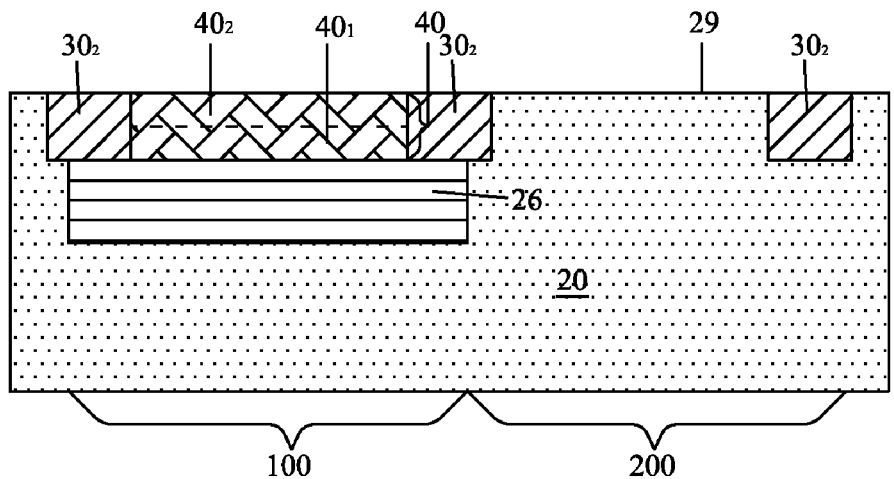

Referring to FIG. 5, semiconductor region 40 is epitaxially grown in recess 32. The top surface of semiconductor region 40 may be substantially level with top surface 29 of region 200 of substrate 20, for example, with a vertical difference less than about 50 Å, although a greater difference is also possible. The material of semiconductor region 40 may be the same as or different from that of dislocation-blocking layer 26. The top portion of semiconductor region 40, which may be part of or include an entirety of upper portion $40_2$, is formed of a material desired by the resulting MOS device. For example, if a PMOS device is to be formed at semiconductor region 40, the top portion of semiconductor region 40 may include a high-hole-mobility material such as germanium. If however, an NMOS device is to be formed at semiconductor region 40, the top portion of semiconductor region 40 may include a high-electron-mobility material such as a III-V compound semiconductor material including, but not limited to, GaAs, InP, GaN, InGaAs, InAlAs, GaAs, GaSb, AlSb, AlAs, AlP, GaP, combinations thereof, and multi-layers thereof. The top portion of semiconductor region 40 may also include an InGaAs quantum well, or a superlattice layer. Semiconductor region 40 may have a substantially uniform composition from bottom to top. Alternatively, semiconductor region 40 may be a gradient layer with the composition changing gradually (either continuously or by stages) from bottom to top. In an embodiment, the bottom portion of semiconductor region 40, which may be part of or include an entirety of lower portion $40_1$, has a lattice constant substantially matching that of the remaining dislocation-blocking layer 26. Semiconductor region 40 may also be grown in recess 32 as shown in FIG. 4B, with the material and the specification of semiconductor region 40 being essentially the same as shown in FIG. 4A.

In an exemplary embodiment, semiconductor region 40 is a germanium-containing region including lower portion $40_1$ and upper portion $40_2$ having different germanium percentages, wherein upper portion $40_2$ may have a higher germanium percentage than lower portion $40_1$. In this case, upper portion $40_2$ may be formed of substantially pure germanium.

Advantageously, lower portion $40_1$ that has the lower germanium percentage may be used as a buffer layer for the portion that has the higher germanium percentage. In other embodiments, semiconductor region 40 may include a region in which the germanium percentage gradually and continuously transitions from lower values to higher values. The germanium percentage of the bottom portion of semiconductor 40 may be substantially close to the germanium percentage of the top portion of the remaining dislocation-blocking layer 26 to match the lattice constants. In yet other embodiments, upper portion $40_2$ may include substantially pure germanium, while lower portion $40_1$ may include a superlattice structure including multiple SiGe layers and multiple substantially pure germanium layers arranged layer-by-layer in an alternating pattern. In yet other embodiments, an entirety of semiconductor region 40 comprises substantially pure germanium, for example, with a germanium concentration of greater than about 90 percent.

Advantageously, by growing semiconductor region 40 from recess 32 that is between STI regions $30_1$, the number of defects (dislocations) in semiconductor region 40 can be significantly lower than the semiconductor films epitaxially grown from blanket wafers, sometimes by two orders or more. Further, dislocation-blocking layer 26 may have a lattice constant between the lattice constant of substrate 20 and the lattice constant of semiconductor region 40, so that dislocation-blocking layer 26 may also act as a buffer layer.

Figure 6:
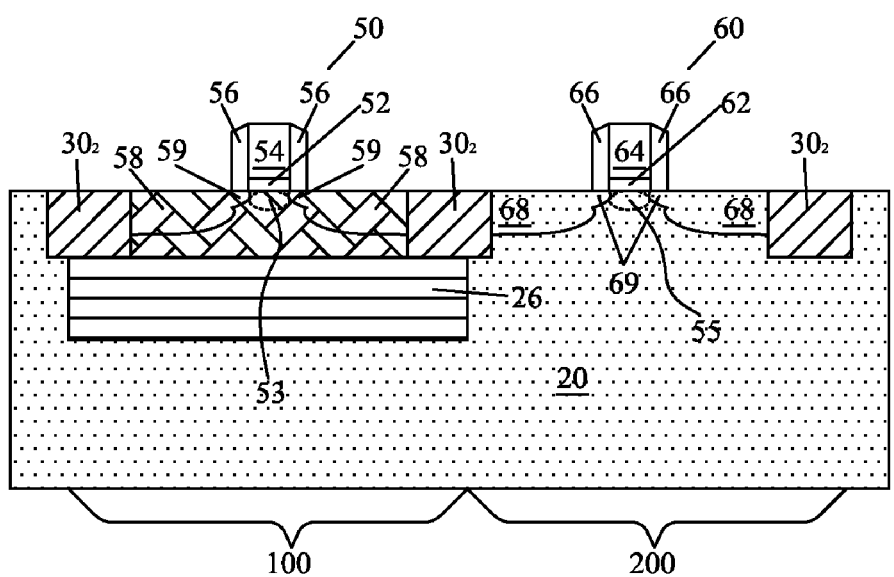

Referring to FIG. 6, MOS device 50 is formed in region 100, wherein MOS device 50 includes gate dielectric 52, gate electrode 54, gate spacers 56, source and drain regions 58, and lightly doped source and drain regions 59. MOS device 60 is formed in region 200, wherein MOS device 60 includes gate dielectric 62, gate electrode 64, gate spacers 66, source and drain regions 68, and lightly doped source and drain regions 69. The formation details of MOS devices 50 and 60 are known in the art, and hence are not repeated herein. MOS devices 50 and 60 may include a PMOS device and an NMOS device. In an embodiment, semiconductor region 40 has a high-electron-mobility and may be formed of, for example, a III-V compound semiconductor material, while region 200 includes silicon or silicon germanium. Accordingly, MOS device 50 is an NMOS device, while MOS device 60 is a PMOS device. In alternative embodiments, semiconductor region 40 has a high-hole-mobility and may be formed of, for example, a germanium-containing semiconductor material, while region 200 may include silicon. Accordingly, MOS device 50 is a PMOS device, while MOS device 60 is an NMOS device. In the resulting MOS device 50, a portion of semiconductor region 40 forms channel region 53. In the resulting MOS device 60, a portion of semiconductor substrate 20 forms channel region 55. Channel region 55 of MOS device 60 may be formed of the same material as that of substrate 20.

The embodiments of the present invention have several advantageous features. By forming a dislocation-blocking layer in the substrate, and growing semiconductor region 40 from the dislocation-blocking layer and in the space between STI regions, the dislocation density in semiconductor region 40 may be significantly reduced. In addition, the top surface of semiconductor region 40 may be substantially level with the top surface of region 200. The subsequent formation of MOS devices 50 and 60 can thus be performed with less process difficulty.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of forming an integrated circuit structure, the method comprising:
    providing a semiconductor substrate;
    forming a first recess in the semiconductor substrate;
    forming a dislocation-blocking layer in the first recess, wherein the dislocation-blocking layer comprises a semiconductor material;
    forming shallow trench isolation (STI) regions, wherein inner portions of the STI regions are directly over portions of the dislocation-blocking layer, and wherein inner sidewalls of the STI regions contact the dislocation-blocking layer;
    forming a second recess by removing a portion of the dislocation-blocking layer between two of the inner sidewalls of the STI regions, wherein the two of the inner sidewalls face each other; and
    epitaxially growing a semiconductor region in the second recess.

2. The method of claim 1, wherein a top surface of the semiconductor region is substantially level with a top surface of an un-recessed portion of the semiconductor substrate.

3. The method of claim 1, wherein, before the step of removing the portion of the dislocation-blocking layer, the STI regions form a closed-loop ring encircling the portion of the dislocation-blocking layer.

4. The method of claim 3, wherein the STI regions do not encircle any portion of the semiconductor substrate.

5. The method of claim 1, wherein, after the step of forming the second recess, a bottom portion of the dislocation-blocking layer remains under the second recess, and wherein the semiconductor region is grown from the bottom portion of the dislocation-blocking layer.

6. The method of claim 5, wherein the semiconductor substrate has a first lattice constant, the semiconductor region has a second lattice constant, and the dislocation-blocking layer has a third lattice constant no greater than a greater one of the first lattice constant and the second lattice constant, and no smaller than a smaller one of the first lattice constant and the second lattice constant.

7. The method of claim 1, wherein the semiconductor region comprises germanium.

8. The method of claim 7, wherein the semiconductor region is formed of substantially pure germanium.

9. The method of claim 7, wherein the dislocation-blocking layer is a gradient layer with a germanium percent in upper layers being greater than that in lower layers of the dislocation-blocking layer.

10. The method of claim 1, wherein the semiconductor region comprises a compound semiconductor material comprising group III and group V elements.

11. The method of claim 1 further comprising:
    forming a first MOS device comprising a portion of the semiconductor region as a first channel region; and
    forming a second MOS device comprising a portion of the semiconductor substrate as a second channel region.

12. A method of forming an integrated circuit structure, the method comprising:
    providing a semiconductor substrate comprising a first region and a second region;
    forming a first recess in the first region without recessing the second region;
    epitaxially growing a dislocation-blocking layer in the first recess;
    forming a shallow trench isolation (STI) region, wherein the STI region forms a ring encircling a center top portion of the dislocation-blocking layer, and wherein the STI region has a bottom contacting a portion of the dislocation-blocking layer directly underlying the STI region;
    etching the center top portion of the dislocation-blocking layer to form a second recess, wherein inner sidewalls of the STI region are exposed, and wherein a portion of the dislocation-blocking layer directly under the second recess remains un-etched;
    epitaxially growing a semiconductor region in the second recess;
    forming a first MOS device over the semiconductor region, the first MOS device comprising a first gate dielectric and a first gate electrode over the first gate dielectric; and
    forming a second MOS device over the second region of the semiconductor substrate, the second MOS device comprising a second gate dielectric and a second gate electrode over the second gate dielectric.

13. The method of claim 12, wherein the semiconductor region comprises a top surface substantially level with a top surface of the second region of the semiconductor substrate.

14. The method of claim 12, wherein the inner sidewalls of the STI region contact the semiconductor region, and outer sidewalls of the STI region contact the second region of the semiconductor substrate.

15. The method of claim 12, wherein the semiconductor substrate is a silicon substrate.

16. The method of claim 12, wherein the semiconductor region comprises germanium, and wherein the first MOS device is a PMOS device, and the second MOS device is an NMOS device.

17. The method of claim 12, wherein the semiconductor region comprises a group III and group V compound semiconductor material, and wherein the first MOS device is an NMOS device, and the second MOS device is a PMOS device.

18. The method of claim 12, wherein the dislocation-blocking layer and the semiconductor region are formed of a same semiconductor material.

19. The method of claim 12, wherein the dislocation-blocking layer and the semiconductor region are formed of different semiconductor materials.

20. The method of claim 12 further comprising performing an annealing between the step of epitaxially growing the dislocation-blocking layer and the step of epitaxially growing the semiconductor region.

* * * * *